United States Patent
Wan et al.

(10) Patent No.: US 12,094,800 B2
(45) Date of Patent: Sep. 17, 2024

(54) THERMALLY CONDUCTIVE SLUGS/ACTIVE DIES TO IMPROVE COOLING OF STACKED BOTTOM DIES

(71) Applicant: Intel Corporation, Santa Clara, CA (US)

(72) Inventors: Zhimin Wan, Chandler, AZ (US); Jin Yang, Hillsboro, OR (US); Chia-Pin Chiu, Tempe, AZ (US); Peng Li, Chandler, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 944 days.

(21) Appl. No.: 16/721,809

(22) Filed: Dec. 19, 2019

(65) Prior Publication Data
US 2021/0193552 A1  Jun. 24, 2021

(51) Int. Cl.
*H01L 23/31* (2006.01)
*H01L 23/367* (2006.01)
(Continued)

(52) U.S. Cl.
CPC ...... *H01L 23/3675* (2013.01); *H01L 23/3121* (2013.01); *H01L 23/3185* (2013.01);
(Continued)

(58) Field of Classification Search
CPC ............. H01L 23/3675; H01L 23/3121; H01L 23/3185; H01L 25/0652; H01L 25/18;
(Continued)

(56) References Cited

U.S. PATENT DOCUMENTS

2010/0117209 A1   5/2010  Bezama
2014/0340849 A1*  11/2014 Kim .................. H01L 23/36
                                                 361/717
(Continued)

FOREIGN PATENT DOCUMENTS

KR   10-2014-0008176   1/2014
WO   WO 2016-130317    9/2016

OTHER PUBLICATIONS

International Search Report and Written Opinion for International Patent Application No. PCT/US2020/048433, mailed Dec. 9, 2020, 11 pgs.
(Continued)

*Primary Examiner* — Antonio B Crite
*Assistant Examiner* — Siangluai Mang
(74) *Attorney, Agent, or Firm* — Schwabe, Williamson & Wyatt P.C.

(57) ABSTRACT

Embodiments include semiconductor packages. A semiconductor package includes first and second bottom dies on a package substrate, first top dies on the first bottom die, and second top dies on the second bottom die. The semiconductor package includes thermally conductive slugs on the first bottom die and the second bottom die. The thermally conductive slugs are comprised of a high thermal conductive material. The thermally conductive slugs are positioned directly on outer edges of top surfaces of the first and second bottom dies, inner edges of the top surfaces of the first and second bottom dies, and/or a top surface of the package substrate. The high thermal conductive material of the thermally conductive slugs is comprised of copper, silver, boron nitride, or graphene. The thermally conductive slugs may have two different thicknesses. The semiconductor package may include an active die and/or an integrated heat spreader with the pedestals.

18 Claims, 3 Drawing Sheets

(51) Int. Cl.
  *H01L 25/065* (2023.01)
  *H01L 25/18* (2023.01)
  *H01L 23/00* (2006.01)
  *H01L 23/373* (2006.01)
  *H01L 23/538* (2006.01)

(52) U.S. Cl.
  CPC .......... *H01L 25/0652* (2013.01); *H01L 25/18* (2013.01); *H01L 23/3731* (2013.01); *H01L 23/3736* (2013.01); *H01L 23/3738* (2013.01); *H01L 23/538* (2013.01); *H01L 24/32* (2013.01); *H01L 2224/32225* (2013.01)

(58) Field of Classification Search
  CPC ............. H01L 23/3731; H01L 23/3736; H01L 23/3738; H01L 23/538; H01L 24/32; H01L 2224/32225
  See application file for complete search history.

(56) References Cited

U.S. PATENT DOCUMENTS

| | | | |
|---|---|---|---|
| 2015/0162307 A1* | 6/2015 | Chen ....................... | H01L 21/56 438/107 |
| 2015/0194375 A1* | 7/2015 | Gowda ................... | H01L 24/19 257/676 |
| 2015/0255427 A1* | 9/2015 | Sung .................... | H01L 23/5383 257/737 |
| 2015/0262904 A1 | 9/2015 | Hung et al. | |
| 2017/0084576 A1* | 3/2017 | Yu ........................... | H01L 21/56 |
| 2017/0372979 A1 | 12/2017 | Gandhi | |
| 2019/0109122 A1 | 4/2019 | Ong | |
| 2019/0214328 A1* | 7/2019 | Eid ...................... | H01L 25/0652 |
| 2019/0267306 A1 | 8/2019 | Raravikar | |
| 2020/0043891 A1* | 2/2020 | Yu ............................ | H01L 24/81 |
| 2020/0118902 A1* | 4/2020 | Neal ................... | H01L 23/3675 |
| 2020/0185330 A1* | 6/2020 | Yu ........................... | H01L 24/19 |
| 2021/0098332 A1* | 4/2021 | Wang ..................... | H01L 25/50 |

OTHER PUBLICATIONS

Search Report from European Patent Application No. 20901581.7 9, mailed Oct. 27, 2023, 8 pgs.
International Preliminary Report on Patentability for International Patent Application No. PCT/US2020/048433 mailed Jun. 30, 2022, 6 pgs.
Office Action for India Patent Application No. 202247016276 mailed Apr. 28, 2023, 5 pgs., with English translation.
Notice of Allowance from European Patent Application No. 20901581. 7, mailed Jun. 11, 2024, 9 pgs.

\* cited by examiner

THERMALLY CONDUCTIVE SLUGS/ACTIVE DIES TO IMPROVE COOLING OF STACKED BOTTOM DIES

FIELD

Embodiments relate to packaging semiconductor devices. More particularly, the embodiments relate to semiconductor devices with stacked dies, thermally conductive slugs, and/or active dies to improve the cooling of the stacked bottom dies.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as microelectronic packages, while optimizing the performance of each device, however is not without issue.

One main issue involves the thermal management of such packages. For example, thermal management of microelectronic packages is becoming extremely important as the power requirements and the number of dies of the microelectronic packages steadily increase. These microelectronic packages typically include stacked dies which includes high power and high density bottom dies. Typically, the performance of these microelectronic packages is limited by the hotspots of the edges of the bottom dies. This leads to other issues as the high power density of the bottom die edges are covered with low thermal conductivity mold materials.

As such, existing packaging solutions may implement high thermal conductivity mold materials over the bottom die edges, attempt to increase the performance of the system cooling solutions, or reduce the thicknesses of the top dies and/or the mold layers. Such existing packaging solutions, however, may substantially increase packaging costs, time, and uncertainty such as leading to other unexpected issues. Furthermore, reducing the top die thicknesses may slightly reduce the hotspot temperature, but the reduction of the top die thickness does not remove (or mitigate) the actual hotspots generated by the edges of the bottom dies.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
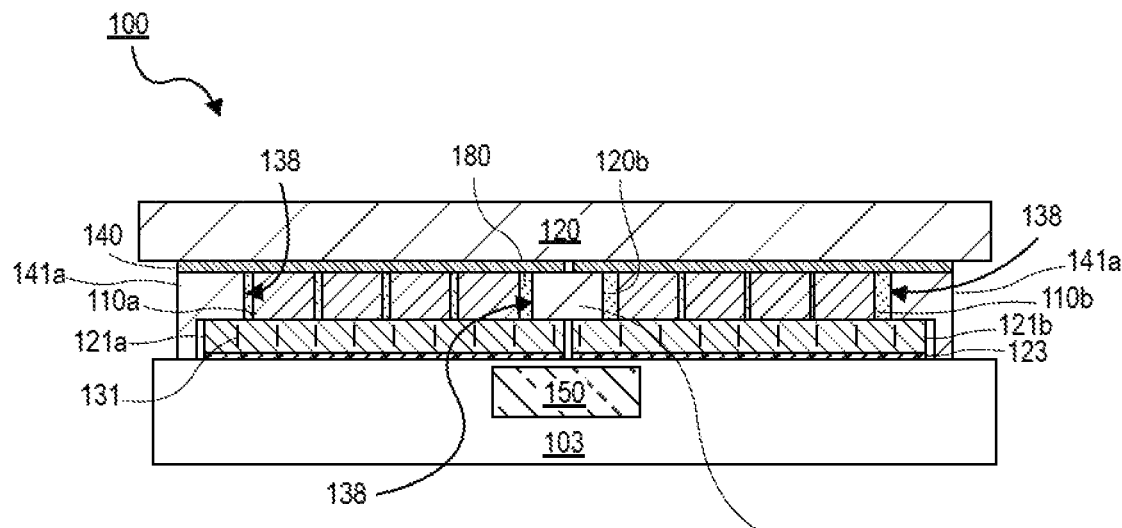
FIG. 1A is an illustration of a cross-sectional view of a semiconductor package with an integrated heat spreader (IHS), a thermal interface material (TIM), a plurality of top dies, a plurality of bottom dies, a plurality of thermally conductive slugs, and a package substrate, according to one embodiment.

Described herein are semiconductor packages with thermally conductive slugs and/or active silicon dies and methods of forming such semiconductor packages. The semiconductor packages described below and methods of forming such semiconductor packages may include an integrated heat spreader (IHS), a thermal interface material (TIM), a plurality of top dies, a plurality of bottom dies, a plurality of thermally conductive slugs, and a package substrate. Additionally, in these embodiments, the semiconductor packages described herein may include an IHS with a plurality of pedestals and/or an active die (e.g., a bridge die, an active silicon die, etc.).

In these embodiments, the semiconductor package may drill/laser a plurality of trenches into the encapsulation layer that surrounds (or embeds) the bottom dies. The trenches may be positioned (or located) over the edges of the bottom dies. Accordingly, in some embodiments, the trenches may expose the top surfaces of the top edges of the bottom dies, and subsequently the thermally conductive slugs may be disposed into the drilled trenches and directly over the exposed top surfaces of the bottom dies, where the thermally conductive slugs may thereby be positioned directly on the top surfaces of the top edges of the bottom dies and the package substrate. Furthermore, in these embodiments, the active die may be disposed into one of the trenches with the thermally conductive slugs, and the active die may be positioned directly over the exposed top surfaces of both of the bottom dies, where the active die may be a bridge (or a bridge die) that may communicatively couple the stacks of bottom dies and top dies to each other. In some alternative embodiments, the pedestals of the IHS may be disposed into the drilled trenches and directly over the exposed top surfaces of the bottom dies, where the pedestals of the IHS may thereby be positioned directly on the top surfaces of the top edges of the bottom dies.

The embodiments described herein provide improvements to existing packaging solutions by substantially increasing the thermal design power (TDP) capabilities of the semiconductor packages described herein. Additionally, these embodiments also enable removing the hotspots generated by the high power and high density bottom dies, which thereby allow the overall temperature of the semiconductor package to be significantly reduced without needing to reduce the thickness (or z-height) of the top dies. The embodiments described herein also improve the packaging solutions by implementing the trenches with a single drilling process (or the like) at no additional costs, where the trenches may be disposed (or filled) with the thermally conductive slugs (or the like). Accordingly, in these embodiments, the thermal resistance from the top edges of the bottom dies to the IHS is significantly reduced due to the highly thermal conductive materials (e.g., copper, silicon, and/or the like) of the thermally conductive slugs, the active die, and/or the pedestals of the IHS.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with IHSs, IHSs with pedestals, top dies, bottom dies, thermally conductive slugs, active dies (or bridge dies), and package substrates with embedded bridge dies.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1A, a cross-sectional illustration of a semiconductor package 100 is shown, in accordance with an embodiment. For some embodiments, the semiconductor package 100 may include an IHS 120, a plurality of top dies 110a-b, a plurality of bottom dies 121a-b, a TIM 140, a plurality of thermally conductive slugs 141a-b, an encapsulation layer 180, and a package substrate 103, according to one embodiment. In one embodiment, the bottom dies 121a-b (or first dies) may be disposed and coupled onto the top surface of the package substrate 103 with an adhesive layer 123 (or the like). For one embodiment, the top dies 110a-b (or the second dies) may be respectively disposed and coupled onto the bottom dies 121a-b.

In some embodiments, the bottom dies 121a-b may include a plurality of interconnects 131 that couple the package substrate 103 to the respective top dies 110a-b. In these embodiments, the interconnects 131 may be through silicon vias (TSVs), through glass vias (TGVs), and/or the like. In some embodiments, as described above, the semiconductor package 100 may include a plurality of trenches 138 (or cavities) disposed into the encapsulation layer 180 and surrounding the thermally conductive slugs 141a-b. In an embodiment, the thermally conductive slugs 141a-b may be positioned directly on the top surface of the bottom dies 121a-b. Likewise, in these embodiments, the thermally conductive slugs 141a-b may be positioned adjacent to the top dies 110a-b and separated by the encapsulation layer 180.

In particular, as shown in FIG. 1A, the thermally conductive slugs 141a-b may be positioned directly on the top surfaces of the top outer edges of the bottom dies 121a-b to remove the formation of hotspots on these top outer edges of the bottom dies 121a-b. For some embodiments, the thermally conductive slugs 141a-b may be directly and thermally coupled to the top outer edges of the bottom dies 121a-b, the TIM 140, and the IHS 120. In an embodiment, the IHS 120 may be disposed over the top dies 110a-b, where the IHS 120 may be coupled to the top dies 110a-b with the TIM 140. For one embodiment, the IHS 120 may be a heatsink or the like, where the heatsink may be a single shared heatsink or two separated heatsinks.

In an embodiment, a bridge 150 may be disposed in the package substrate 103, and the bridge 150 may communicatively couple the bottom die 121a to the bottom die 121b. In an embodiment, the bridge 150 may comprise electrical routings (or interconnect structures) that may communicatively couple the bottom die 121a to the bottom die 121b. In an embodiment, the bridge 150 may be a silicon bridge, a glass bridge, or a bridge made of any other substrate material that is suitable for forming bridges. In some embodiments, the bridge 150 may be referred to as an embedded multi-die interconnect bridge (EMIB). For additional embodiments, the bridge 150 may include a plurality of TSVs that may be used to communicatively couple the bottom dies 121a-b.

For one embodiment, the encapsulation layer 180 may be disposed over the bottom dies 121a-b, where the encapsulation layer 180 also surrounds the top dies 110a-b and the thermally conductive slugs 141a-b. Additionally, as shown in FIG. 1A, the encapsulation layer 180 may be disposed in between the top dies 110a-b, where the encapsulation layer 180 may be disposed between the top surfaces of the bottom dies 121a-b and the bottom surface of the TIM 140. For one embodiment, the encapsulation layer 180 may be planarized as the top surface of the encapsulation layer 180 may be substantially coplanar to the top surfaces of the top dies 110a-b.

Note that, according to some embodiment, the semiconductor package 100 is merely one example of an embodiment of a semiconductor packaged system. That is, the semiconductor package 100 is not limited to the illustrated semiconductor packaged system, and thus may be designed/formed with fewer, alternate, or additional packaging components and/or with different interconnecting structures. For example, while one IHS 120, one TIM 140, two thermally conductive slugs 141a, one thermally conductive slug 141b, two bottom dies 121a-b, two sets of top dies 110a-b, and one package substrate 103 with one bridge 150 are illustrated, it is to be appreciated that the semiconductor package 100 may include any number of IHSs 120, TIMs 140, thermally conductive slugs 141a-b, bottom dies 121a-b, sets of top dies 110a-b, and package substrates 103 with bridges 150.

For one embodiment, the semiconductor package 100 may include a ball grid array (BGA) package, a land grid array (LGA) package, and/or a pin grid array (PGA) package. In other embodiments, one or more of the bottom dies 121a-b, the top dies 110a-b, and/or the package substrate 103 may be coupled via solder balls (or the like) that may be implemented as solder bumps/joints formed from respective microbumps. A solder ball (or joint) formed by soldering of a microbump according to an embodiment may itself be referred to as a "bump" and/or a "microbump." Additionally, for other embodiments, one or more of the top dies 110a-b, the bottom dies 121a-b, and the package substrate 103 may be coupled using an anisotropic conductive film (ACF) or the like.

The package substrate 103 may include a variety of electronic structures formed thereon or therein. In certain embodiments, the package substrate 103 may be an organic substrate made up of one or more layers of polymer base materials or ceramic base materials, with conducting regions for transmitting signals. For some embodiments, the package substrate 103 may include, but is not limited to, a package, a substrate, a printed circuit board (PCB), and a motherboard. In one embodiment, the package substrate 103 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where the dielectric layers may be a photosensitive dielectric layer. For one embodiment, the PCB may also include one or more conductive layers, which may further include copper (or metallic) traces, lines, pads, vias, holes, and/or planes.

For one embodiment, the bottom dies 121a-b and the top dies 110a-b may be comprised, but are not limited to, a semiconductor die, an electronic device (e.g., a wireless device), an integrated circuit (IC), a central processing unit (CPU), a graphic processing unit (GPU), a microprocessor, a platform controller hub (PCH), a memory (e.g., a high bandwidth memory (HBM)), and/or a field-programmable gate array (FPGA). Additionally, in other embodiments, the bottom dies 121a-b may be comprised of one or more materials, including glass, crystal, diamond, low thermal conductive materials, high thermal conductive materials (e.g., gallium nitride (GaN) or the like), silicon, glass-based materials, and/or silicon-based materials (e.g., silicon carbide (SiC) or the like). As described above, in some embodiments, the top dies 110a-b may be a plurality of chiplet dies. While, in another embodiment, the top dies 110a and/or the top dies 110b may be a single monolithic die instead of multiple chiplet dies. The bottom dies 121a-b and the top dies 110a-b may be formed from a material such as silicon and have circuitry thereon that is to be coupled to the package substrate 103 and/or each other. Although some embodiments are not limited in this regard, the package substrate 103 may in turn be coupled to another body, for example, a computer motherboard (or the like).

For one embodiment, the bottom dies 121a may have a thickness that is substantially equal to a thickness of the bottom dies 121b. For one embodiment, the bottom dies 121a-b may have a thickness of approximately 100 um or less. In some embodiments, the top dies 110a may have a thickness that is substantially equal to a thickness of the top dies 110b. For one embodiment, the top dies 110a-b may have a thickness of approximately 200 um to 600 um. In some embodiments, the top dies 110a-b may have a thickness that is substantially equal or different from a thickness of bottom dies 121a-b. For one embodiment, the top dies 110a-b may have a top surface that is substantially coplanar to a top surface of the encapsulation layer 180. Note that, in some embodiments, the thickness of the TIM 140 disposed over the top dies 110a may be substantially equal to or different from the thickness of the TIM 140 that is disposed over the top dies 110b. For one embodiment, the TIM 140 may have a thickness of approximately 25 um to 400 um.

One or more connections between the package substrate 103, the top dies 110a-b, and the bottom dies 121a-b may include one or more interconnect structures and underfill layers if desired. In some embodiments, these interconnect structures (or connections) may variously comprise an alloy of nickel, palladium, and tin (and, in some embodiments, copper). For one embodiment, the underfill layers may be one or more polymer materials that are injected between the respective components. Alternatively, the underfill layers may be molded underfills (MUF) or the like.

In one embodiment, the encapsulation layer 180 may fully and/or partially surround the outer sidewalls of the top die 110a-b and/or the thermally conductive slugs 141a-b. For example, in one embodiment, the encapsulation layer 180 may fully surround the thermally conductive slug 141b, whereas the encapsulation layer 180 may be disposed between the outer sidewalls of the top dies 110 and the thermally conductive slugs 141a. Note that, in alternate embodiments, the encapsulation layer 180 may be implemented to partially or fully surround the bottom dies 121a-b. In some embodiments the encapsulation layer 180 may include one or more encapsulation materials such as a mold material, an underfill material, a filler material, any similar materials, and/or any combination thereof.

Additionally, as described above, the thermally conductive slugs 141a-b may be disposed directly on the top outer edges of the top dies 110a-b. Furthermore, in these embodiments, one of the thermally conductive slugs 141a may be respectively positioned on one of the bottom dies 121a-b and the package substrate 103 (e.g., as shown with the two thermally conductive slugs 141a on the left and right), and the thermally conductive slug 141b may be directly positioned on both of the bottom dies 121a-b (e.g., as shown with the one thermally conductive slug 141b in the middle). As such, in these embodiments, as shown in FIG. 1A, the thermally conductive slugs 141a-b may have the same widths or different widths based on the desired packaging design.

According to some embodiments, the thermally conductive slugs 141a-b may be comprised of copper or the like. Likewise, in some embodiments, the thermally conductive slugs 141a-b may be comprised of one or more highly thermal conductive materials, such as, but not limited to, copper, silver, boron nitride, graphene, and/or the like. For example, in these embodiments, the thermally conductive slugs 141a-b may have a high thermal conductivity of approximately 400 W/mK or greater.

In some embodiments, the thermally conductive slugs 141a-b may have one or more thicknesses, where the thermally conductive slugs 141a may have a first thickness, and the thermally conductive slug 141b may have a second thickness. For example, the first thickness of the thermally conductive slugs 141a may be greater than the second thickness of the thermally conductive slug 141b, where the first thickness of the thermally conductive slugs 141a may be defined from the top surface of the package substrate 103 to the bottom surface of the TIM 140, and where the second thickness of the thermally conductive slug 141b may be defined from the top surfaces of the bottom dies 121a-b to the bottom surface of the TIM 140.

In these embodiments, the first thickness of the thermally conductive slugs 141a may be approximately 400 um to 1000 um. In another embodiment, the first thickness of the thermally conductive slugs 141a may be approximately 1000 um or less. In some embodiments, the second thickness of the thermally conductive slug 141b may be approximately 200 um to 600 um. In another embodiment, the second thickness of the thermally conductive slugs 141b may be approximately 600 um or less.

Moreover, as shown in FIG. 1A, the thermally conductive slugs 141a may be shaped as thermally conductive block regions with pedestals (or legs). In these embodiments, the thermally conductive slugs 141a may have two different thicknesses, where the thermally conductive block regions of the thermally conductive slugs 141a may be directly disposed and coupled onto the top outer edges of the bottom dies 121a-b, and where the pedestals of the thermally conductive slugs 141a may be directly disposed and coupled onto the top surface of the package substrate 103. That is, in these embodiments, the thermally conductive block regions of the thermally conductive slugs 141a may have a thickness that is substantially equal to the second thickness of the thermally conductive slug 141b (e.g., a thickness of approximately 200 um to 600 um), while the thermally conductive pedestals of the thermally conductive slugs 141a may have a thickness that is substantially equal to the first thickness of the thermally conductive slug 141a (e.g., a thickness of approximately 400 um to 1000 um). Note that, as shown in FIG. 1A, a slight gap may be implemented between the pedestals of the thermally conductive slugs 141a and the outer sidewalls of the bottom dies 121a-b. Additionally, in some embodiments, the thermally conductive block regions of the thermally conductive slugs 141a, the thermally conductive slug 141b, and/or the trenches 138 may have one or more sidewalls that are shaped as tapered sidewalls and/or substantially vertical sidewalls.

Furthermore, the TIM 140 may be directly disposed and coupled onto the top surfaces of the top dies 110a-b, the encapsulation layer 180, and/or the thermally conductive slugs 141a-b, where the TIM 140 may be positioned between the top surfaces of the top dies 110a-b and the bottom surface of the IHS 120. In one embodiment, the TIM 140 may be a solder TIM (STIM) such as an indium STIM or the like. In other embodiments, the TIM 140 may include one or more highly thermal conductivity materials such as a metallic TIM, a STIM, a polymer TIM (PTIM), and/or any similar highly thermal conductive material(s). The TIM 140 may be two split/separated TIMs or one single/shared TIM based on the desired packaging design.

In one embodiment, the IHS 120 may be disposed over the TIM 140, the top dies 110a-b, the bottom dies 121a-b, and the package substrate 103. The IHS 120 may be manufactured (or shaped) to include a lid and/or a plurality of legs (or pedestals), where the lid of the IHS 120 may be directly disposed on the top surface of the TIM 140, and the legs of the IHS 120 may be directly disposed on the top surface of the package substrate 103. In some embodiments, the IHS 120 may be a heatsink, a heat spreader, a heat exchanger, a manifold, a cold plate, and/or any similar thermal solution (or device) that may be used to help transfer the heat from the electrical components of the semiconductor package 100 to the ambient environment (or an additional heat spreader). In some embodiments, the IHS 120 may be a shared heatsink disposed over both the top dies 110a-b, or the IHS 120 may be a split heatsink separated into two separate heatsinks individually disposed over the top dies 110a only and the top dies 110b only.

Note that the semiconductor package 100 of FIG. 1A may include fewer or additional packaging components based on the desired packaging design.

Figure 1B:
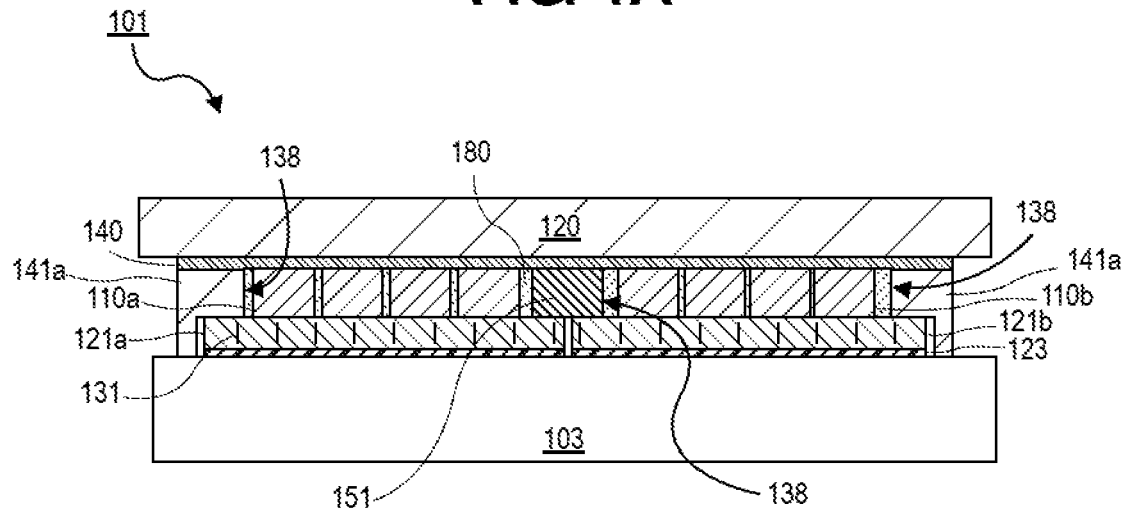
FIG. 1B is an illustration of a cross-sectional view of a semiconductor package with an IHS, a TIM, a plurality of top dies, a plurality of bottom dies, a plurality of thermally conductive slugs, an active die, and a package substrate, according to one embodiment.

Referring now to FIG. 1B, a cross-sectional illustration of a semiconductor package 101 is shown, in accordance with an embodiment. For some embodiments, the semiconductor package 101 may be substantially similar to the semiconductor package 100 described above in FIG. 1A, with the exception that an active die 151 may be disposed on the top inner edges of both of the bottom dies 121a-b, and that the active die 151 may thus replace the thermally conductive slug 141b and the bridge 150 of FIG. 1A. That is, whereas the bridge 150 is embedded within the package substrate 103 of FIG. 1A, the active die 151 may be disposed and coupled onto the top inner edges of both of the bottom dies 121a-b, where the active die 151 may be implemented to communicatively couple the stack of the top dies 110a and bottom die 121a to the stack of the top dies 110b and bottom die 121b without requiring an embedded bridge in the package substrate 103, according to some embodiments.

In these embodiments, the active die 151 may be an active silicon die or the like. As shown in FIG. 1B, the active die 151 may be surrounded (or embedded) with the encapsulation layer 180, the TIM 140, and the bottom dies 121a-b, where the active die 151 may be directly positioned between the top dies 110a and the top dies 110b. In one embodiment, the active die 151 may have a top surface that is substantially coplanar to the top surfaces of the top dies 110a-b, where the active dies 151 may have a thickness that is substantially equal to the thickness of the top dies 110a-b (e.g., the thickness may be approximately 200 um to 600 um). Moreover, in some embodiments, the active die 151 may have a width of approximately 1 mm to 4 mm. While, in another embodiment, the active die 151 may have a width of approximately 4 mm or less.

In particular, for these embodiments, the active die 151 may be a bridge (or a bridge die). For one embodiment, the active die 151 may comprise electrical routings (or interconnect structures) that may communicatively couple the bottom die 121a to the bottom die 121b. In an embodiment, the active die 151 may be a silicon bridge, a glass bridge, or a bridge made of any other substrate material that is suitable for forming bridges. In some embodiments, the active die 151 may be referred to as an EMIB. For additional embodiments, the active die 151 may include a plurality of TSVs that may be used to communicatively couple the bottom dies 121a-b and/or the top dies 110a-b.

Note that the semiconductor package 101 of FIG. 1B may include fewer or additional packaging components based on the desired packaging design.

Figure 1C:
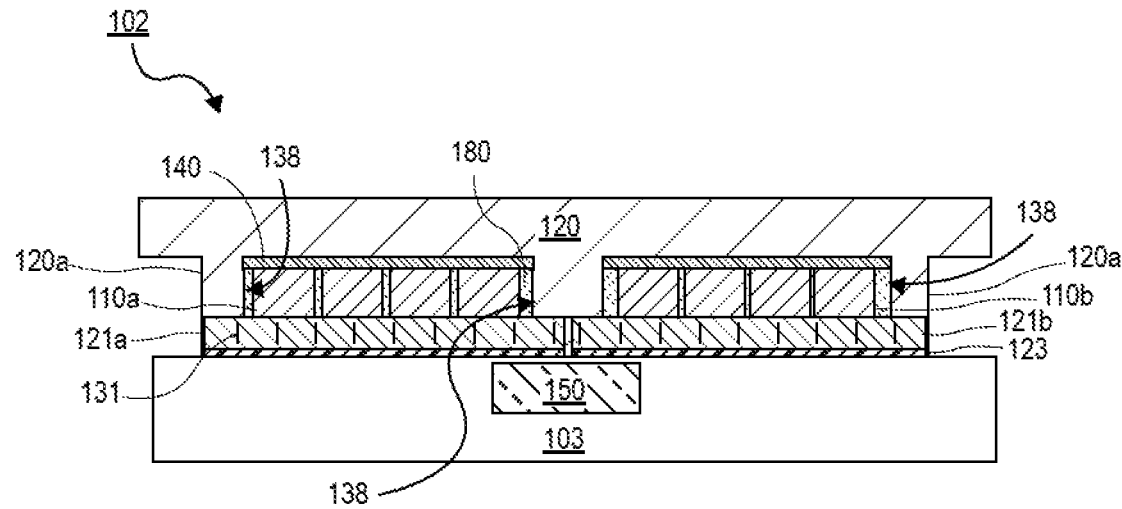
FIG. 1C is an illustration of a cross-sectional view of a semiconductor package with an IHS with a plurality of pedestal, a TIM, a plurality of top dies, a plurality of bottom dies, and a package substrate, according to one embodiment.

Referring now to FIG. 1C, a cross-sectional illustration of a semiconductor package 102 is shown, in accordance with an embodiment. For some embodiments, the semiconductor package 102 may be substantially similar to the semiconductor package 100 described above in FIG. 1A, with the exception that the IHS 120 may include a plurality of pedestals 120a-b, and that the pedestals 120a-b of the IHS 120 may replace the thermally conductive slugs 140a-b of FIG. 1A. That is, whereas the thermally conductive slugs 141a-b are disposed and coupled onto the top surfaces of the bottom dies 121a-b of FIG. 1A, the pedestals 120a-b of the IHS 120 may be disposed and directly coupled onto the top surfaces of the bottom dies 121a-b, where the pedestals 120a-b may be part of the IHS 120 and/or directly coupled onto the bottom surface of the IHS 120, according to some embodiments.

In these embodiments, the pedestals 120a-b may be implemented as a plurality of legs on the IHS 120, where the pedestals 120a-b may be comprised of the same thermally conductive material as the IHS 120. As shown in FIG. 1C, the pedestals 120a-b may be surrounded (or embedded) with the encapsulation layer 180, the TIM 140, and the bottom dies 121a-b, where the pedestals 120a-b may be directly positioned between the top surfaces of the bottom dies 121a-b and the bottom surface of the IHS 120. In one embodiment, the pedestals 120a-b of the IHS 120 may have a thickness of approximately 300 um to 900 um. While, in another embodiment, the pedestals 120a-b of the IHS 120 may have a thickness of approximately 900 um or less. In these embodiments, the pedestals 120a-b of the IHS 120 may have a thickness that is greater than (or greater than or equal to) a thickness of the top dies 110a-b.

Moreover, in some embodiments, the pedestal 120b (or a second pedestal) may have a width of approximately 1 mm to 4 mm. While, in another embodiment, the pedestal 120b may have a width of approximately 4 mm or less. In these embodiments, the pedestal 120b may have a width that is greater than a width of the pedestals 120a (or a plurality of first pedestals). In some embodiments, the pedestals 120a-b may have one or more sidewalls that are shaped as tapered sidewalls and/or substantially vertical sidewalls. In an alternative embodiment, the pedestal 120b may be replaced with an active die similar to the active die 151 described above in FIG. 1B.

Note that the semiconductor package 102 of FIG. 1C may include fewer or additional packaging components based on the desired packaging design.

Figure 2A:
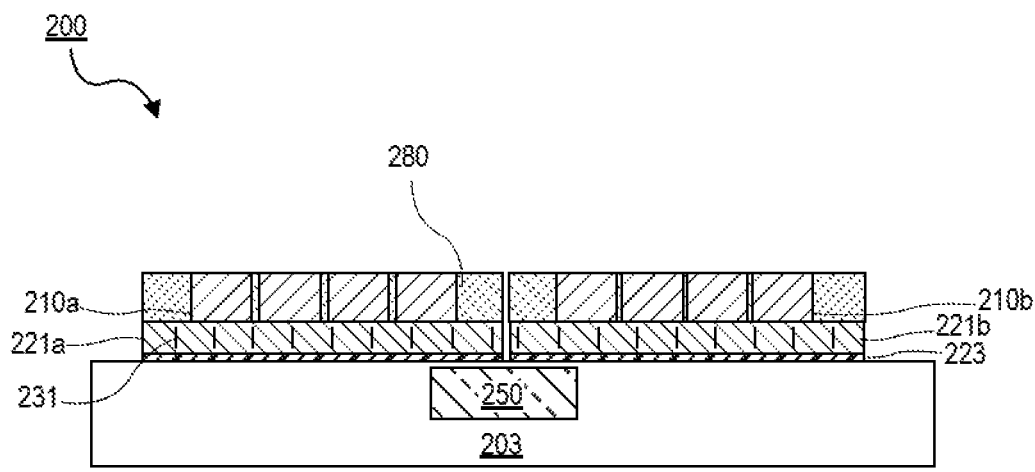
FIGS. 2A-2C are illustrations of cross-sectional views of a semiconductor package with an IHS, a TIM, a plurality of top dies, a plurality of bottom dies, a plurality of thermally conductive slugs, and a package substrate, according to some embodiments.
Figure 2B:
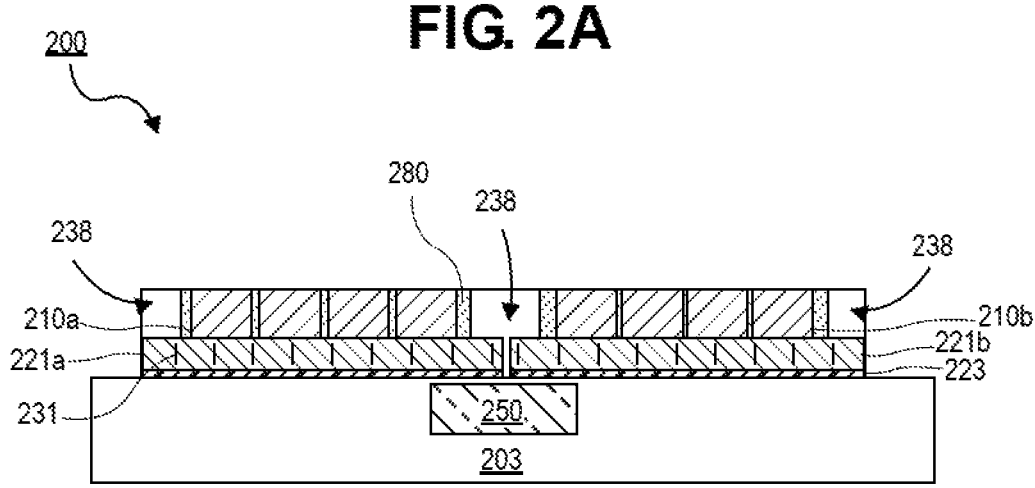
Figure 2C:
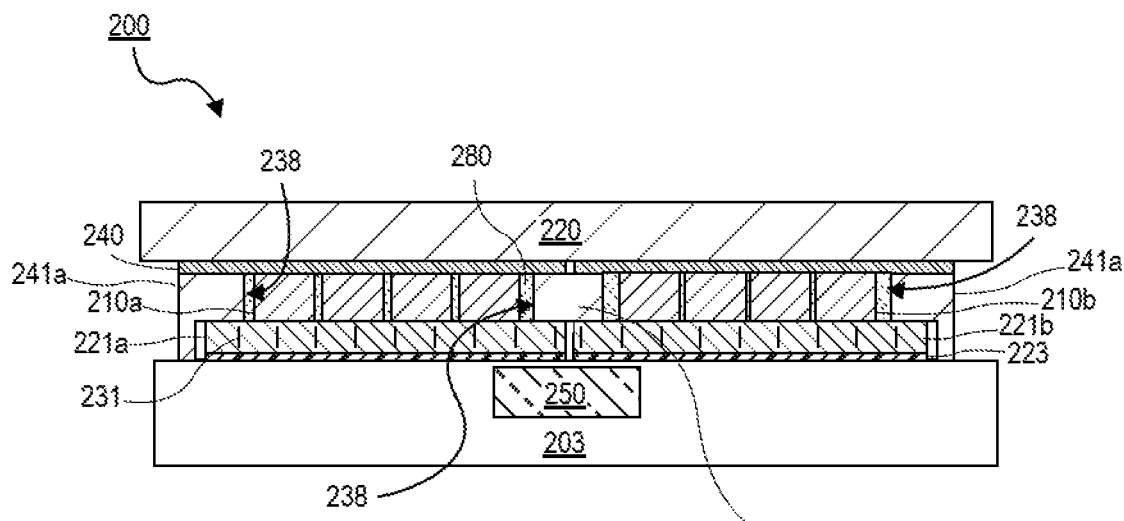

FIGS. 2A-2C are cross-sectional illustrations of a semiconductor package 200, in accordance with some embodiments. For some embodiments, as shown in FIGS. 2A-2C, the semiconductor package 200 may include an IHS 220, a TIM 240, an encapsulation layer 280, a plurality of trenches 238, a plurality of thermally conductive slugs 241a-b, a plurality of top dies 210a-b, a plurality of bottom dies 221a-b, a plurality of interconnects 231, an adhesive layer 223, a bridge 250, and a package substrate 203. In these embodiments, the semiconductor package 200 of FIGS. 2A-2C with the thermally conductive slugs 241a-b may be substantially similar to the semiconductor package 100 with the thermally conductive slugs 141a-b described above in FIG. 1A.

Likewise, the components of the semiconductor package 200 may be substantially similar to the components of the semiconductor package 100 described above in FIG. 1A. Accordingly, the IHS 220, the TIM 240, the encapsulation layer 280, the trenches 238, the top dies 210a-b, the bottom dies 221a-b, the interconnects 231, the adhesive layer 223, the bridge 250, and the package substrate 203 may be substantially similar to the IHS 120, the TIM 140, the encapsulation layer 180, the trenches 138, the top dies 110a-b, the bottom dies 121a-b, the interconnects 131, the adhesive layer 123, the bridge 150, and the package substrate 103 described above in FIG. 1A.

Referring now to FIG. 2A, a cross-sectional illustration of a semiconductor package 200 is shown, in accordance with an embodiment. For some embodiments, the semiconductor package 200 may include the top dies 210a-b and bottom dies 221a-b respectively stacked on the package substrate 203, where the bottom dies 221a-b may be coupled to the package substrate 203 with the adhesive layer 223. The encapsulation layer 280 may be disposed over the top surface of the bottom dies 221a-b and surrounds the top dies 210a-b, where the encapsulation layer 280 may be particularly disposed on the top outer edges of the bottom dies 221a-b. In some embodiments, the top surface of the encapsulation layer 280 may be planarized with a polishing/grinding process (or the like) and may thus be substantially coplanar to the top surface of the top dies 210a-b.

Referring now to FIG. 2B, a cross-sectional illustration of a semiconductor package 200 is shown, in accordance with an embodiment. For some embodiments, the semiconductor package 200 may implement the trenches 238 into the encapsulation layer 280, where the trenches 238 may expose the top surface of the bottom dies 221a-b. In an embodiment, the trenches 238 may be implemented with a drilling process, a laser process, or the like, where the drilled/lasered trenches may have tapered sidewalls or substantially vertical sidewalls. As described above, the trenches 238 may provide openings over the top edges of the bottom dies 221a-b.

Referring now to FIG. 2C, a cross-sectional illustration of a semiconductor package 200 is shown, in accordance with an embodiment. For some embodiments, the thermally conductive slugs 241a-b may be disposed (or deposited/plated) into the trenches 238 with a plating process (or the like) to implement the thermally conductive slugs 241a-b directly on the top edges of the respective bottom dies 221a-b. In these embodiments, the TIM 240 may then be disposed over the thermally conductive slugs 241a-b, the encapsulation layer 280, and the top dies 210a-b. Lastly, as shown in FIG. 2C, the IHS 220 may be disposed over the TIM 240 and the package substrate 203, where the thermally conductive slugs 241a-b may thus create a low thermal resistance path from the top edges of the bottom dies 221a-b to the TIM 240 and the IHS 220—and thus substantially improve the TDP of the semiconductor package 200. Furthermore, in alternative embodiments, the semiconductor package 200 may be implemented with an active die (e.g., the active die 151 of FIG. 1B) and/or one or more pedestals with the IHS 220 (e.g., the pedestals 120a-b of FIG. 1C).

Note that the semiconductor package 200 of FIGS. 2A-2C may include fewer or additional packaging components based on the desired packaging design.

Figure 3:
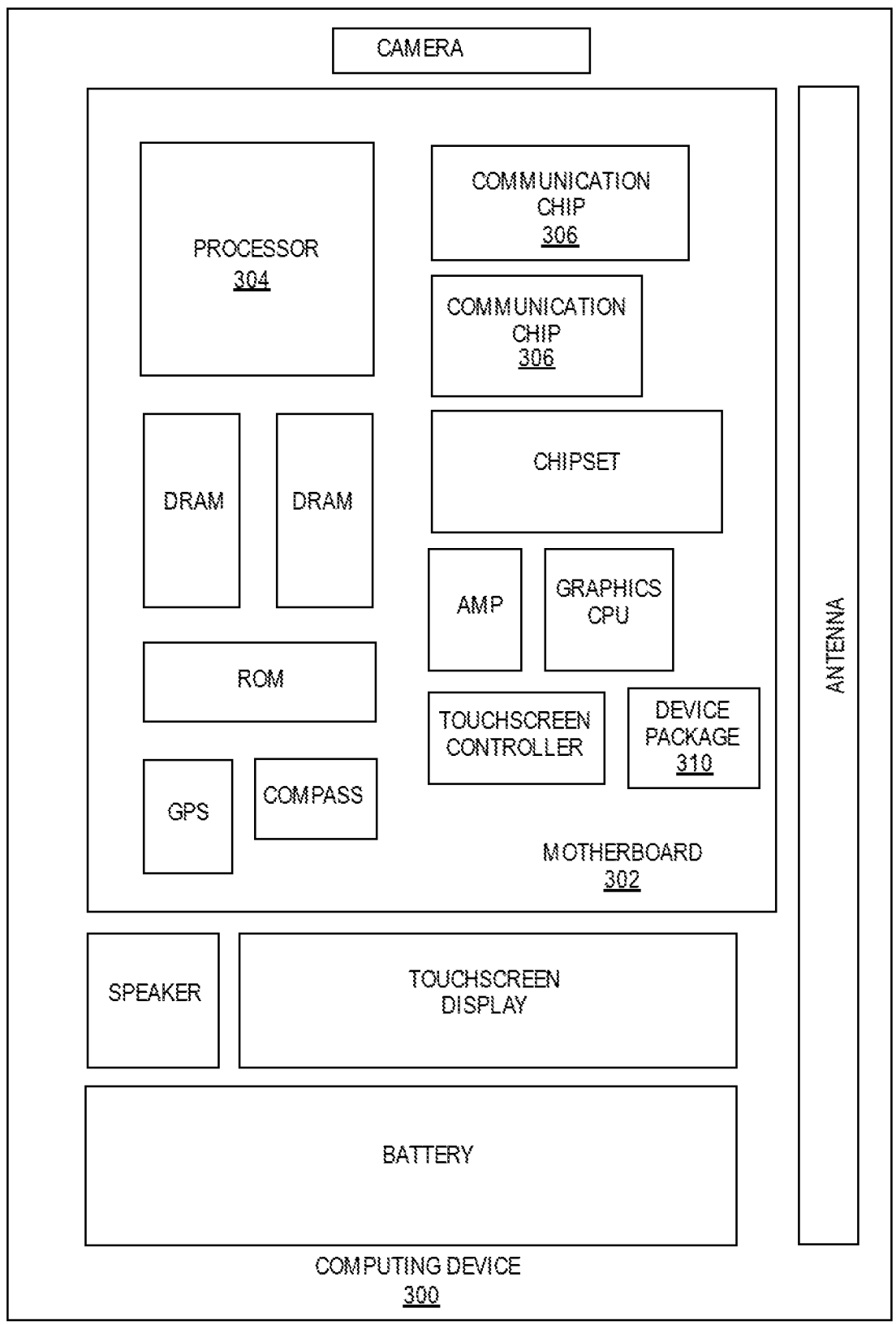
FIG. 3 is an illustration of a schematic block diagram illustrating a computer system that utilizes a semiconductor package with an IHS, a TIM, a plurality of top dies, a plurality of bottom dies, a plurality of thermally conductive slugs, and a package substrate, according to one embodiment.

FIG. 3 is an illustration of a schematic block diagram illustrating a computer system 300 that utilizes a device package 310 (or a semiconductor package) with an IHS, a TIM, a plurality of top dies, a plurality of bottom dies, a plurality of thermally conductive slugs, a plurality of pedestals of an IHS, an active die, and/or a package substrate, according to one embodiment. FIG. 3 illustrates an example of computing device 300. Computing device 300 houses a motherboard 302. Motherboard 302 may include a number of components, including but not limited to processor 304, device package 310 (or semiconductor package), and at least one communication chip 303. Processor 304 is physically and electrically coupled to motherboard 302. For some embodiments, at least one communication chip 306 is also physically and electrically coupled to motherboard 302. For other embodiments, at least one communication chip 306 is part of processor 304.

Depending on its applications, computing device 300 may include other components that may or may not be physically and electrically coupled to motherboard 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 306 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. Device package 310 may be a semiconductor package that may include, but is not limited to, a substrate, a package substrate, and/or a PCB. In one embodiment, device package 310 may be substantially similar to the semiconductor packages 100-102 and 200 of FIGS. 1A-1C and 2A-2C described herein. Device package 310 may include the thermally conductive slugs (and/or the active die, the pedestals of the IHS, etc.) directly disposed and coupled onto the top surfaces of the bottom dies and/or the package substrate as described herein (e.g., as illustrated and described above with the thermally conductive slugs, the active die, and/or the pedestals of the IHS of FIGS. 1A-1C and 2A-2C)—or any other components from the figures described herein.

Note that device package 310 may be a single component/device, a subset of components, and/or an entire system, as the materials, features, and components may be limited to device package 310 and/or any other component of the computing device 300 that may need the thermally conductive slugs (and/or the active die, the pedestals of the IHS, etc.) as described herein (e.g., the motherboard 302, the processor 304, and/or any other component of the computing device 300 that may need the embodiments of the semiconductor packages described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 306 also includes an integrated circuit die packaged within the communication chip 306. For some embodiments, the integrated circuit die of the communication chip 306 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a first bottom die and a second bottom die on a package substrate, wherein the first bottom die is adjacent to the second bottom die; a plurality of first top dies on the first bottom die, and a plurality of second top dies on the second bottom die; a plurality of thermally conductive slugs on the first bottom die and the second bottom die, wherein the plurality of thermally conductive slugs are comprised of a high thermal conductive material, and wherein the plurality of thermally conductive slugs include a plurality of first thermally conductive slugs and a second thermally conductive slug; an encapsulation layer over the first and second bottom dies, wherein the encapsulation layer surrounds the plurality of first top dies, the plurality of second top dies, and the second thermally conductive slug; and a TIM over the plurality of first top dies, the plurality of second top dies, the plurality of thermally conductive slugs, and the encapsulation layer.

In example 2, the subject matter of example 1 can optionally include that the plurality of first thermally conductive slugs are positioned directly on a top surface of the package substrate, wherein the plurality of first thermally conductive slugs are also positioned directly on an outer edge of a top surface of the first bottom die and an outer edge of a top surface of the second bottom die, and wherein the second thermally conductive slug is positioned directly on an inner edge of the top surface of the first bottom die and an inner edge of the top surface of the second bottom die.

In example 3, the subject matter of examples 1-2 can optionally include that the plurality of thermally conductive slugs have top surfaces that are substantially coplanar to a top surface of the encapsulation layer and a top surface of the plurality of first and second top dies.

In example 4, the subject matter of examples 1-3 can optionally include that the high thermal conductive material of the plurality of thermally conductive slugs is comprised of copper, silver, boron nitride, or graphene.

In example 5, the subject matter of examples 1-4 can optionally include that the plurality of first thermally conductive slugs have a first thickness that is greater than a second thickness of the second thermally conductive slug.

In example 6, the subject matter of examples 1-5 can optionally include that the second thickness of the second thermally conductive slug is substantially equal to a thickness of the plurality of first and second top dies.

In example 7, the subject matter of examples 1-6 can optionally include that the top surface of the first bottom die is substantially coplanar to the top surface of the second bottom die, wherein the plurality of first thermally conductive slugs are shaped as a plurality of thermally conductive block regions with a plurality of pedestals, wherein the plurality of thermally conductive block regions of the plurality of first thermally conductive slugs have a third thickness that is substantially equal to the second thickness of the second thermally conductive slug, wherein the first thickness of the plurality of first thermally conductive slugs is greater than the third thickness of the plurality of first thermally conductive slugs, wherein the thermally conductive block regions of the plurality of first thermally conductive slugs are coupled directly on the outer edges of the top surfaces of the first and second bottom dies, wherein the plurality of pedestals of the plurality of first thermally conductive slugs are coupled directly on the top surface of the package substrate, wherein the encapsulation layer is directly on the top surfaces of the first and second bottom dies, and wherein the plurality of first thermally conductive slugs are separated from the plurality of respective first and second top dies by the encapsulation layer.

In example 8, the subject matter of examples 1-7 can optionally include a bridge in the package substrate, wherein the bridge communicatively couples the first bottom die to the second bottom die, wherein the first and second bottom dies include a plurality of interconnects, and wherein the plurality of interconnects of the first and second bottom dies communicatively couple the package substrate to the plurality of respective first and second top dies; an adhesive layer couples the package substrate to the first and second bottom dies; and an IHS over the TIM, the plurality of thermally conductive slugs, and the package substrate, wherein the plurality of thermally conductive slugs thermally couple the top surfaces of the first and second bottom dies to the IHS, and wherein the TIM is positioned between a bottom surface of the IHS and the top surfaces of the first and second top dies, the plurality of thermally conductive slugs, and the encapsulation layer.

In example 9, the subject matter of examples 1-8 can optionally include that the plurality of pedestals of the plurality of first thermally conductive slugs are separated from the respective first and second bottom dies by a slight gap, and wherein the plurality of thermally conductive slugs have tapered sidewalls or substantially vertical sidewalls.

Example 10 is a semiconductor package, comprising: a first bottom die and a second bottom die on a package substrate, wherein the first bottom die is adjacent to the second bottom die; a plurality of first top dies on the first bottom die, and a plurality of second top dies on the second bottom die; a plurality of thermally conductive slugs on the first bottom die and the second bottom die, wherein the plurality of thermally conductive slugs are comprised of a high thermal conductive material; an active die on the first bottom die and the second bottom die, wherein the active die communicatively couples the first bottom die to the second bottom die; an encapsulation layer over the first and second bottom dies, wherein the encapsulation layer surrounds the plurality of first top dies, the plurality of second top dies, and the active die; and a TIM over the plurality of first top dies, the plurality of second top dies, the plurality of thermally conductive slugs, the active die, and the encapsulation layer.

In example 11, the subject matter of example 10 can optionally include that the plurality of thermally conductive slugs are positioned directly on a top surface of the package substrate, wherein the plurality of thermally conductive slugs are also positioned directly on an outer edge of a top surface of the first bottom die and an outer edge of a top surface of the second bottom die, and wherein the active die is positioned directly on an inner edge of the top surface of the first bottom die and an inner edge of the top surface of the second bottom die.

In example 12, the subject matter of examples 10-11 can optionally include that the plurality of thermally conductive slugs have top surfaces that are substantially coplanar to a top surface of the encapsulation layer and a top surface of the plurality of first and second top dies, and wherein the active die has a top surface that is substantially coplanar to the top surfaces of the plurality of thermally conductive slugs, the plurality of first and second top dies, and the encapsulation layer.

In example 13, the subject matter of examples 10-12 can optionally include that the high thermal conductive material of the plurality of thermally conductive slugs is comprised of copper, silver, boron nitride, or graphene, and wherein the active die is an active silicon die or an EMIB die.

In example 14, the subject matter of examples 10-13 can optionally include that the plurality of thermally conductive slugs have a first thickness that is greater than a second thickness of the active die.

In example 15, the subject matter of examples 10-14 can optionally include that the second thickness of the active die is substantially equal to a thickness of the plurality of first and second top dies.

In example 16, the subject matter of examples 10-15 can optionally include that the top surface of the first bottom die is substantially coplanar to the top surface of the second bottom die, wherein the plurality of thermally conductive slugs are shaped as a plurality of thermally conductive block regions with a plurality of pedestals, wherein the plurality of thermally conductive block regions of the plurality of thermally conductive slugs have a third thickness that is substantially equal to the second thickness of the active die, wherein the first thickness of the plurality of thermally conductive slugs is greater than the third thickness of the plurality of thermally conductive slugs, wherein the thermally conductive block regions of the plurality of thermally conductive slugs are coupled directly on the outer edges of the top surfaces of the first and second bottom dies, wherein the plurality of pedestals of the plurality of thermally conductive slugs are coupled directly on the top surface of the package substrate, wherein the encapsulation layer is directly on the top surfaces of the first and second bottom dies, and wherein the plurality of thermally conductive slugs are separated from the plurality of respective first and second top dies by the encapsulation layer.

In example 17, the subject matter of examples 10-16 can optionally include that a plurality of interconnects in the first and second bottom dies, wherein the plurality of interconnects of the first and second bottom dies communicatively couple the package substrate to the plurality of respective first and second top dies; an adhesive layer couples the package substrate to the first and second bottom dies; and an IHS over the TIM, the plurality of thermally conductive slugs, the active die, and the package substrate, wherein the plurality of thermally conductive slugs thermally couple the top surfaces of the first and second bottom dies to the IHS, and wherein the TIM is positioned between a bottom surface of the IHS and the top surfaces of the first and second top dies, the plurality of thermally conductive slugs, the active die, and the encapsulation layer.

In example 18, the subject matter of examples 10-17 can optionally include that the plurality of pedestals of the plurality of thermally conductive slugs are separated from the respective first and second bottom dies by a slight gap, and wherein the plurality of thermally conductive slugs have tapered sidewalls or substantially vertical sidewalls.

Example 19 is a semiconductor package, comprising: a first bottom die and a second bottom die on a package substrate, wherein the first bottom die is adjacent to the second bottom die, wherein the package substrate includes a bridge that communicatively couples the first bottom die to the second bottom die; a plurality of first top dies on the first bottom die, and a plurality of second top dies on the second bottom die; an encapsulation layer over the first and second bottom dies; a TIM over the plurality of first top dies, the plurality of second top dies, and the encapsulation layer; and an IHS with a plurality of pedestals over the TIM, the first and second bottom dies, and the package substrate, wherein the plurality of pedestals of the IHS are on the first bottom die and the second bottom die, wherein the plurality of pedestals of the IHS are comprised of a high thermal conductive material, wherein the pedestals of the IHS include a plurality of first pedestals and a second pedestal, and wherein the encapsulation layer surrounds the plurality of first top dies, the plurality of second top dies, and the pedestals of the IHS.

In example 20, the subject matter of example 19 can optionally include that the plurality of first pedestals are positioned directly on an outer edge of a top surface of the first bottom die and an outer edge of a top surface of the second bottom die, and wherein the second pedestal is positioned directly on an inner edge of the top surface of the first bottom die and an inner edge of the top surface of the second bottom die.

In example 21, the subject matter of examples 19-20 can optionally include that the encapsulation layer has a top surface that is substantially coplanar to a top surface of the plurality of first and second top dies, wherein the pedestals of the IHS have a thickness that is greater than a thickness of the plurality of first and second top dies, and wherein the plurality of first pedestals have a first width that is greater than a second width of the second pedestal.

In example 22, the subject matter of examples 19-21 can optionally include that the high thermal conductive material of the pedestals of the IHS is comprised of copper, silver, boron nitride, or graphene, wherein the first and second bottom dies include a plurality of interconnects, wherein the plurality of interconnects of the first and second bottom dies communicatively couple the package substrate to the plurality of respective first and second top dies, wherein the package substrate is coupled to the first and second bottom dies with an adhesive layer, wherein the plurality of pedestals of the IHS are thermally coupled to the top surfaces of the first and second bottom dies, and wherein the TIM is positioned between a bottom surface of the IHS and the top surfaces of the first and second top dies and the encapsulation layer.

In example 23, the subject matter of examples 19-22 can optionally include that the second pedestal of the IHS is surrounded by the encapsulation layer and the TIM.

In example 24, the subject matter of examples 19-23 can optionally include that the top surface of the first bottom die is substantially coplanar to the top surface of the second bottom die, wherein the encapsulation layer is directly on the top surfaces of the first and second bottom dies, and wherein the plurality of first pedestals of the IHS are separated from the plurality of respective first and second top dies by the encapsulation layer.

In example 25, the subject matter of examples 19-24 can optionally include that the pedestals of the IHS have tapered sidewalls or substantially vertical sidewalls.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a first bottom die and a second bottom die on a package substrate, wherein the first bottom die is adjacent to the second bottom die;
   a plurality of first top dies on the first bottom die, and a plurality of second top dies on the second bottom die;
   a plurality of thermally conductive slugs on the first bottom die and the second bottom die, wherein the plurality of thermally conductive slugs are comprised of a high thermal conductive material, and wherein the plurality of thermally conductive slugs include a plurality of first thermally conductive slugs and a second thermally conductive slug, the second thermally conductive slug on the first bottom die and on the second bottom die;
   an encapsulation layer over the first and second bottom dies, wherein the encapsulation layer surrounds the plurality of first top dies, the plurality of second top dies, and the second thermally conductive slug; and
   a thermal interface material (TIM) over the plurality of first top dies, the plurality of second top dies, the plurality of thermally conductive slugs, and the encapsulation layer.

2. The semiconductor package of claim 1, wherein the plurality of first thermally conductive slugs are positioned directly on a top surface of the package substrate, wherein the plurality of first thermally conductive slugs are also positioned directly on an outer edge of a top surface of the first bottom die and an outer edge of a top surface of the second bottom die, and wherein the second thermally conductive slug is positioned directly on an inner edge of the top surface of the first bottom die and an inner edge of the top surface of the second bottom die.

3. The semiconductor package of claim 2, wherein the plurality of thermally conductive slugs have top surfaces that are substantially coplanar to a top surface of the encapsulation layer and a top surface of the plurality of first and second top dies.

4. The semiconductor package of claim 1, wherein the high thermal conductive material of the plurality of thermally conductive slugs is comprised of copper, silver, boron nitride, or graphene.

5. The semiconductor package of claim 1, wherein the plurality of first thermally conductive slugs have a first thickness that is greater than a second thickness of the second thermally conductive slug.

6. The semiconductor package of claim 5, wherein the second thickness of the second thermally conductive slug is substantially equal to a thickness of the plurality of first and second top dies.

7. The semiconductor package of claim 3, wherein the top surface of the first bottom die is substantially coplanar to the top surface of the second bottom die, wherein the plurality of first thermally conductive slugs are shaped as a plurality of thermally conductive block regions with a plurality of pedestals, wherein the plurality of thermally conductive block regions of the plurality of first thermally conductive slugs have a third thickness that is substantially equal to the second thickness of the second thermally conductive slug, wherein the first thickness of the plurality of first thermally conductive slugs is greater than the third thickness of the plurality of first thermally conductive slugs, wherein the thermally conductive block regions of the plurality of first thermally conductive slugs are coupled directly on the outer edges of the top surfaces of the first and second bottom dies, wherein the plurality of pedestals of the plurality of first thermally conductive slugs are coupled directly on the top surface of the package substrate, wherein the encapsulation layer is directly on the top surfaces of the first and second bottom dies, and wherein the plurality of first thermally conductive slugs are separated from the plurality of respective first and second top dies by the encapsulation layer.

8. The semiconductor package of claim 7, further comprising:
a bridge in the package substrate, wherein the bridge communicatively couples the first bottom die to the second bottom die, wherein the first and second bottom dies include a plurality of interconnects, and wherein the plurality of interconnects of the first and second bottom dies communicatively couple the package substrate to the plurality of respective first and second top dies;
an adhesive layer couples the package substrate to the first and second bottom dies; and
an integrated heat spreader (IHS) over the TIM, the plurality of thermally conductive slugs, and the package substrate, wherein the plurality of thermally conductive slugs thermally couple the top surfaces of the first and second bottom dies to the IHS, and wherein the TIM is positioned between a bottom surface of the IHS and the top surfaces of the first and second top dies, the plurality of thermally conductive slugs, and the encapsulation layer.

9. The semiconductor package of claim 8, wherein the plurality of pedestals of the plurality of first thermally conductive slugs are separated from the respective first and second bottom dies by a slight gap, and wherein the plurality of thermally conductive slugs have tapered sidewalls or substantially vertical sidewalls.

10. A semiconductor package, comprising:
a first bottom die and a second bottom die on a package substrate, wherein the first bottom die is adjacent to the second bottom die;
a plurality of first top dies on the first bottom die, and a plurality of second top dies on the second bottom die;
a plurality of thermally conductive slugs on the first bottom die and the second bottom die, wherein the plurality of thermally conductive slugs are comprised of a high thermal conductive material;
an active die on the first bottom die and the second bottom die, wherein the active die communicatively couples the first bottom die to the second bottom die, and wherein the first bottom die and the second bottom die extend laterally beyond outermost sides of the active die;
an encapsulation layer over the first and second bottom dies, wherein the encapsulation layer surrounds the plurality of first top dies, the plurality of second top dies, and the active die; and
a thermal interface material (TIM) over the plurality of first top dies, the plurality of second top dies, the plurality of thermally conductive slugs, the active die, and the encapsulation layer.

11. The semiconductor package of claim 10, wherein the plurality of thermally conductive slugs are positioned directly on a top surface of the package substrate, wherein the plurality of thermally conductive slugs are also positioned directly on an outer edge of a top surface of the first bottom die and an outer edge of a top surface of the second bottom die, and wherein the active die is positioned directly on an inner edge of the top surface of the first bottom die and an inner edge of the top surface of the second bottom die.

12. The semiconductor package of claim 11, wherein the plurality of thermally conductive slugs have top surfaces that are substantially coplanar to a top surface of the encapsulation layer and a top surface of the plurality of first and second top dies, and wherein the active die has a top surface that is substantially coplanar to the top surfaces of the plurality of thermally conductive slugs, the plurality of first and second top dies, and the encapsulation layer.

13. The semiconductor package of claim 10, wherein the high thermal conductive material of the plurality of thermally conductive slugs is comprised of copper, silver, boron nitride, or graphene, and wherein the active die is an active silicon die or an embedded multi-die interconnect bridge (EMIB) die.

14. The semiconductor package of claim 10, wherein the plurality of thermally conductive slugs have a first thickness that is greater than a second thickness of the active die.

15. The semiconductor package of claim 14, wherein the second thickness of the active die is substantially equal to a thickness of the plurality of first and second top dies.

16. The semiconductor package of claim 12, wherein the top surface of the first bottom die is substantially coplanar to the top surface of the second bottom die, wherein the plurality of thermally conductive slugs are shaped as a plurality of thermally conductive block regions with a plurality of pedestals, wherein the plurality of thermally conductive block regions of the plurality of thermally conductive slugs have a third thickness that is substantially equal to the second thickness of the active die, wherein the first thickness of the plurality of thermally conductive slugs is greater than the third thickness of the plurality of thermally conductive slugs, wherein the thermally conductive block regions of the plurality of thermally conductive slugs are coupled directly on the outer edges of the top surfaces of the first and second bottom dies, wherein the plurality of pedestals of the plurality of thermally conductive slugs are coupled directly on the top surface of the package substrate, wherein the encapsulation layer is directly on the top surfaces of the first and second bottom dies, and wherein the plurality of thermally conductive slugs are separated from the plurality of respective first and second top dies by the encapsulation layer.

17. The semiconductor package of claim 16, further comprising:
a plurality of interconnects in the first and second bottom dies, wherein the plurality of interconnects of the first and second bottom dies communicatively couple the package substrate to the plurality of respective first and second top dies;
an adhesive layer couples the package substrate to the first and second bottom dies; and
an integrated heat spreader (IHS) over the TIM, the plurality of thermally conductive slugs, the active die, and the package substrate, wherein the plurality of thermally conductive slugs thermally couple the top surfaces of the first and second bottom dies to the IHS, and wherein the TIM is positioned between a bottom surface of the IHS and the top surfaces of the first and second top dies, the plurality of thermally conductive slugs, the active die, and the encapsulation layer.

18. The semiconductor package of claim 17, wherein the plurality of pedestals of the plurality of thermally conductive slugs are separated from the respective first and second bottom dies by a slight gap, and wherein the plurality of thermally conductive slugs have tapered sidewalls or substantially vertical sidewalls.

* * * * *